US012578782B2

(12) United States Patent
Wang et al.

(10) Patent No.: US 12,578,782 B2
(45) Date of Patent: Mar. 17, 2026

(54) POWER-ON CONTROL METHOD, ELECTRONIC DEVICE, AND STORAGE MEDIUM

(71) Applicant: Lenovo (Beijing) Limited, Beijing (CN)

(72) Inventors: Jun Wang, Beijing (CN); Xiangyun Kong, Beijing (CN); Jui Feng Hsiao, Beijing (CN); Xingxin Sun, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 130 days.

(21) Appl. No.: 18/384,263

(22) Filed: Oct. 26, 2023

(65) Prior Publication Data

US 2024/0143063 A1     May 2, 2024

(30) Foreign Application Priority Data

Oct. 28, 2022     (CN) .......................... 202211336420.8

(51) Int. Cl.
 *G06F 1/00*          (2006.01)
 *G06F 1/3296*        (2019.01)
 *H03K 3/017*         (2006.01)

(52) U.S. Cl.
 CPC ........... *G06F 1/3296* (2013.01); *H03K 3/017* (2013.01)

(58) Field of Classification Search
 CPC .............................. G06F 1/3296; H03K 3/017
 See application file for complete search history.

(56) References Cited

U.S. PATENT DOCUMENTS

| | | | | | |
|---|---|---|---|---|---|
| 10,818,253 | B2 * | 10/2020 | Park | ...................... | G09G 3/3648 |
| 10,958,167 | B2 * | 3/2021 | Price | ........................ | H03K 5/24 |
| 2012/0062605 | A1 * | 3/2012 | Aioanei | ............... | G09G 3/3406 |
| | | | | | 345/102 |
| 2016/0141892 | A1 * | 5/2016 | Li | ........................ | H02J 7/00712 |
| | | | | | 320/137 |
| 2023/0120265 | A1 * | 4/2023 | Hashimoto | .......... | G09G 3/2011 |
| | | | | | 345/214 |

* cited by examiner

*Primary Examiner* — Mohammed H Rehman
(74) *Attorney, Agent, or Firm* — ANOVA LAW GROUP, PLLC

(57)          ABSTRACT

A power-on control method, a power-on control apparatus and an electronic device are provided in the present disclosure. The power-on control method includes, in response to receiving a power-on command, switching an enable signal of a power control chip from a low level to a high level, and monitoring an output voltage of the power control chip; and performing pulse-width modulation on the enable signal according to an increasing trend of the output voltage to control an increasing rate of the output voltage.

7 Claims, 9 Drawing Sheets

S101

In response to receiving a power-on command, switching an enable signal of a power control chip from a low level to a high level, and monitoring an output voltage of the power control chip

S102

Performing pulse-width modulation on the enable signal according to an increasing trend of the output voltage to control an increasing rate of the output voltage Turnon Response Turnon Response Time (1ms/div)

POWER-ON CONTROL METHOD, ELECTRONIC DEVICE, AND STORAGE MEDIUM

CROSS-REFERENCE TO RELATED APPLICATION

This application claims the priority of Chinese Patent Application No. 202211336420.8, filed on Oct. 28, 2022, the content of which is incorporated herein by reference in its entirety.

TECHNICAL FIELD

The present disclosure generally relates to the field of display technology, and, more particularly, relates to a power-on control method, an electronic device, and a storage medium.

BACKGROUND

With continuous update of electronic devices, graphics processing unit (GPU) cards are configured with a large number of capacitors. The electronic device may carry a GPU load during normal operation. However, when the electronic device is just powered on, the capacitor of the GPU may need to be fully charged quickly, and the current may be significantly higher than normal load of the GPU. Overcurrent occurring at the booting process may cause power problem to the GPU.

A power IC (integrated circuit) controller may use larger Css capacitors. When an enable (EN) pin is changed from 0 to 1, the Css capacitor may be charged. The voltage of Css may vary with the use of capacitor, and increasing slopes of the voltage may be different. The larger the capacitor is, the slower the voltage increases. The voltage is required to charge the GPU capacitor. When the GPU capacitance is certain, the faster the voltage increases, the greater the current required to charge the GPU capacitor is, and the greater overcurrent risk is.

SUMMARY

One aspect of the present disclosure provides a power-on control method. The power-on control method includes, in response to receiving a power-on command, switching an enable signal of a power control chip from a low level to a high level, and monitoring an output voltage of the power control chip; and performing pulse-width modulation on the enable signal according to an increasing trend of the output voltage to control an increasing rate of the output voltage.

Another aspect of the present disclosure provides an electronic device. The electronic device includes a memory, configured to store a computer program; and a processor, coupled to the memory and, when the computer program is executed, configured to: in response to receiving a power-on command, switch an enable signal of a power control chip from a low level to a high level, and monitor an output voltage of the power control chip; and perform pulse-width modulation on the enable signal according to an increasing trend of the output voltage to control an increasing rate of the output voltage.

Another aspect of the present disclosure provides a non-transitory computer-readable storage medium, containing a computer program that, when being executed, causes a processor to: in response to receiving a power-on command, switch an enable signal of a power control chip from a low level to a high level, and monitor an output voltage of the power control chip; and perform pulse-width modulation on the enable signal according to an increasing trend of the output voltage to control an increasing rate of the output voltage.

Other aspects of the present disclosure may be understood by those skilled in the art in light of the description, the claims, and the drawings of the present disclosure.

DETAILED DESCRIPTION

In order to understand the features and technical content of embodiments of the present disclosure in detail, implementations of embodiments of the present disclosure are described in detail below with reference to accompanying drawings. The accompanying drawings are for reference only and are not intended to limit embodiments of the present disclosure.

Unless otherwise defined, all technical and scientific terms used herein have same meaning as commonly understood by those skilled in the art in the present disclosure. The terms used herein are only for the purpose of describing embodiments of the present disclosure and are not intended to limit the present disclosure.

In the following description, references are made to "some embodiments" which describe a subset of all possible embodiments. However, it should be understood that "some embodiments" may be a same subset or different subsets of all possible embodiments and may be combined with each other without conflict. It should also be noted that the terms "first\second\third" in embodiments of the present disclosure are only used to distinguish similar objects and do not represent a specific order of objects. It may be understood that "first\second\third" may interchange specific orders or sequences when needed, so that embodiments of the present disclosure described herein may be implemented sequentially in other manners than those illustrated or described herein.

With continuous update of electronic devices, graphics processing unit (GPU) cards are configured with a large number of capacitors. The electronic device may carry a GPU load during normal operation. However, when the electronic device is just powered on, the capacitor of the GPU may need to be fully charged quickly, and the current may be significantly higher than normal load of the GPU. Overcurrent occurring at the booting process may cause power problem to the GPU.

Figures 1, 2:
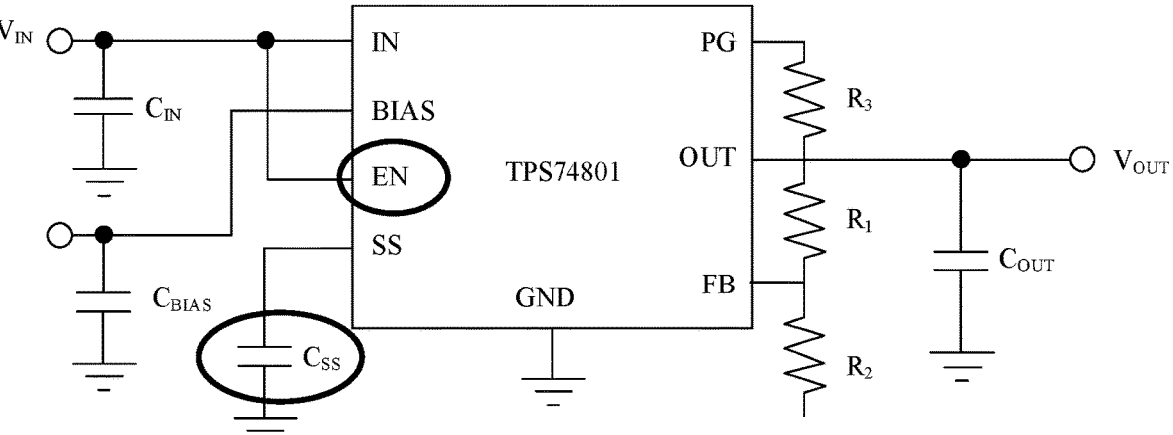
FIG. 1 illustrates a flowchart of an exemplary power-on control method according to various embodiments of the present disclosure.
FIG. 2 illustrates a structural schematic of an exemplary power control chip.
Figure 3:
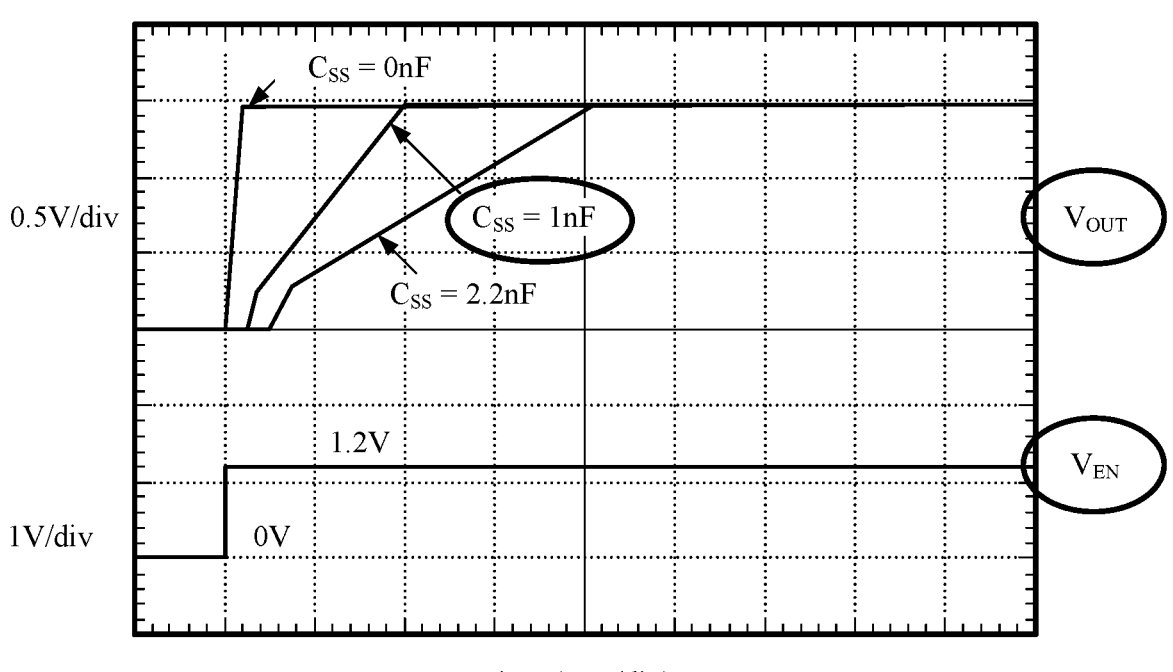
FIG. 3 illustrates a schematic of a voltage increase process in an exemplary power control method.

Referring to FIG. 2, FIG. 2 illustrates a structural schematic of an exemplary power control chip. As shown in FIG. 2, a power IC controller may use larger Css capacitors. When an enable (EN) pin is changed from 0 to 1, the Css capacitor may be charged, and the voltage of Css may vary with use of the capacitor. Referring to FIG. 3, FIG. 3 illustrates a schematic of a voltage increase process in an exemplary power control method. As shown in FIG. 3, the increasing slopes of the voltage may be different. The larger the capacitor is, the slower the voltage increases. The voltage is required to charge the GPU capacitor. When the GPU capacitance is certain, the faster the voltage increases, the greater the current required to charge the GPU capacitor is, and the greater overcurrent risk is.

At initial motherboard design, in order to comprehensively consider various factors, the power-on slope of the voltage may often take an intermediate value. However, as configuration continues to increase in later design period, such value may cause the power of the GPU to be abnormal due to excessive startup current when more GPU cards are configured. If the power of the GPU has abnormal problem when more GPU needs to be supported during power-on, the CSS capacitor may be replaced with a larger capacitor to slow down the output voltage increasing rate, so that the GPU may be powered normally after power-on. The motherboard hardware may need to be changed, which may require a long time and various resources and may be difficult to be managed.

Based on above, embodiments of the present disclosure provide a power-on control method. The basic concept of such method is the following. When receiving a power-on command, the enable signal of the power control chip may be switched from a low level to a high level, and the output voltage of the power control chip may be monitored; and the enable signal may be pulse-width modulated according to the increasing trend of the output voltage to control the increasing rate of the output voltage. In such way, the increasing rate of the output voltage may be controlled by adjusting the pulse-width of the enable signal, thereby reducing overcurrent risk during power-on.

In one embodiment of the present disclosure, referring to FIG. 1, FIG. 1 illustrates a flowchart of a power-on control method according to various embodiments of the present disclosure. As shown in FIG. 1, the method may include following exemplary steps.

At S101, in response to receiving a power-on command, the enable signal of the power control chip is switched from a low level to a high level, and the output voltage of the power control chip is monitored.

It should be noted that the power-on control method provided by embodiments of the present disclosure can be applied to a power-on control apparatus or an electronic device integrated with a power-on control apparatus. The electronic device may be a computer, a smartphone, a tablet, a laptop, a handheld computer, a personal digital assistant (PDA), an augmented reality (AR) virtual device, a virtual reality (VR) virtual device and/or the like, which may not be limited in detail herein.

It should also be noted that in embodiments of the present disclosure, after receiving the power-on command, the power control signal may receive a high-level enable signal, and the output voltage may start to increase. At this point, the output voltage may be detected to determine whether the increasing trend of the output voltage is within a reasonable range. In response to that the output voltage increases extremely fast, the enable signal may need to be adjusted to obtain ideal increasing slope of the output voltage.

At S102, pulse-width modulation may be performed on the enable signal according to the increasing trend of the output voltage to control the increasing rate of the output voltage.

It should be noted that in embodiments of the present disclosure, when the slope of the output voltage is higher than a reasonable range, the enable signal may be pulse-width modulated. The adjustment of the output voltage may be based on the increasing trend of the voltage. In response to that the increasing rate of the output voltage is extremely fast, the enable signal must be pulse-width modulated; and in response to that the voltage increasing trend is reasonable, the enable signal may not need to be adjusted, which may be still correct for different devices and different stages of a same device.

In some embodiments, performing the pulse-width modulation on the enable signal according to the increasing trend of the output voltage to control the increasing rate of the output voltage may include obtaining the increasing rate of current output voltage; based on the ratio of a target increasing rate to the increasing rate of current output voltage, determining a target duty cycle of the enable signal for the pulse-width modulation; and according to the target duty cycle, performing the pulse-width modulation on the enable signal to control the increasing rate of the output voltage.

It should be noted that in embodiments of the present disclosure, the increasing rate of current output voltage and the target increasing rate may be determined, and the enable signal may be pulse modulated according to the ratio of such two rates. The greater the ratio of the target increasing rate to current increasing rate of the output voltage is, the smaller the target duty cycle is. The smaller the ratio of the target increasing rate to current output voltage increasing rate is, the greater the target duty cycle is. When the ratio of the target increasing rate to current increasing rate of the output voltage is 1, the pulse modulation may be not required.

In some embodiments, determining the target duty cycle of the enable signal for the pulse-width modulation based on the ratio of the target increasing rate to the increasing rate of current output voltage may include, in response to that the increasing rate of current output voltage is greater than the target increasing rate, reducing current duty cycle corresponding to current output voltage; and determining reduced duty cycle to be the target duty cycle.

It should be noted that in embodiments of the present disclosure, in response to that the increasing rate of current output voltage is greater than the target increasing rate, current duty cycle corresponding to current output voltage may be reduced, such that the increasing rate of current output voltage may be reduced; and according to the ratio of the increasing rate of current output voltage to the target increasing rate, the target duty cycle may be determined, such that the increasing rate of the output voltage may be reduced to satisfy preset requirement.

In some embodiments, determining the target duty cycle of the enable signal for the pulse-width modulation based on the ratio of the target increasing rate to the increasing rate of current output voltage may include, in response to that the increasing rate of current output voltage is less than the target increasing rate, increasing current duty cycle corresponding to current output voltage; and determining increased duty cycle to be the target duty cycle.

It should be noted that in embodiments of the present disclosure, in response to that the increasing rate of current output voltage is less than the target increasing rate, current duty cycle corresponding to current output voltage may be increased, such that the increasing rate of current output voltage may be increased; and according to the ratio of the increasing rate of current output voltage to the target increasing rate, current duty cycle may be determined, such that the increasing rate of the output voltage may be increased to satisfy preset requirement.

In some embodiments, determining the target duty cycle of the enable signal for the pulse-width modulation based on the ratio of the target increasing rate to the increasing rate of current output voltage may include, in response to that the increasing rate of current output voltage is equal to the target increasing rate, determining current duty cycle corresponding to the current output voltage to be the target duty cycle.

It should be noted that in embodiments of the present disclosure, in response to that the increasing rate of current output voltage is equal to the target increasing rate, current duty cycle may be determined to be the target duty cycle, such that the increasing rate of the output voltage may remain unchanged to satisfy preset requirement.

In some embodiments, determining the target duty cycle of the enable signal for the pulse-width modulation based on the ratio of the target increasing rate to the increasing rate of current output voltage may include calculating the ratio of the target increasing rate to current duty cycle corresponding to current output voltage; and determining the ratio to be the target duty cycle.

It should be noted that in embodiments of the present disclosure, the ratio of the target increasing rate to the increasing rate of current output voltage may be determined, and the ratio of the target increasing rate to the increasing rate of the current output voltage may be determined as the current duty cycle. That is, the duty cycle=expected slope/original slope.

In some embodiments, determining the target duty cycle of the enable signal for the pulse-width modulation based on the ratio of the target increasing rate to the increasing rate of current output voltage may include calculating the ratio of the target increasing rate to current duty cycle corresponding to the increasing rate of current output voltage; and determining the ratio to be the target duty cycle.

It should be noted that in embodiments of the present disclosure, the ratio of the target increasing rate to the increasing rate of current output voltage may be determined; the ratio of the target increasing rate to the increasing rate of current output voltage may be determined as current duty cycle; and entire voltage increase range may be adjusted to ensure that the output slopes are consistent, which may solve the problem of rapid increase in current initial stage and slow increase in later stage.

In some embodiments, the method may further include that in response to that a discharge circuit is inside the power control chip, the duty cycle of the pulse-width modulation of the enable signal may be greater than the target duty cycle.

It should be noted that in embodiments of the present disclosure, when the capacitor is discharging, actual voltage increasing slope may be smaller than ideal situation without discharge. Therefore, during the pulse modulation process, the duty cycle may be increased appropriately, so that when the pulse modulated waveform is configured as the enable signal, the voltage increasing slope may be consistent with expectations and may meet the charging need of the capacitor without causing overcurrent.

In some embodiments, the method may further include in response to that the output voltage does not start to increase, maintaining the enable signal to be inputted at a high level; and in response to that the output voltage reaches a preset ratio, maintaining the enable signal to be inputted at a high level.

It should be noted that in embodiments of the present disclosure, during a same power-on process, in response to that the output voltage does not start to increase, the enable signal may be maintained as a high-voltage DC (direct current), and the pulse-width modulation signal may not be configured as the enable signal. After the output voltage value increases to 85% of an expected value (e.g., as an example of reaching a preset ratio), in order to avoid abnormal output, the pulse modulation strategy may be canceled, and the high-voltage DC input mode may be restored.

Embodiments of the present disclosure provide a power-on control method. When receiving a power-on command, the enable signal of the power control chip may be switched from a low level to a high level, and the output voltage of the power control chip may be monitored; and the enable signal may be pulse-width modulated according to the increasing trend of the output voltage to control the increasing rate of the output voltage. In such way, the increasing rate of the output voltage may be controlled by adjusting the pulse-width of the enable signal, thereby reducing overcurrent risk during power-on.

Figure 4:
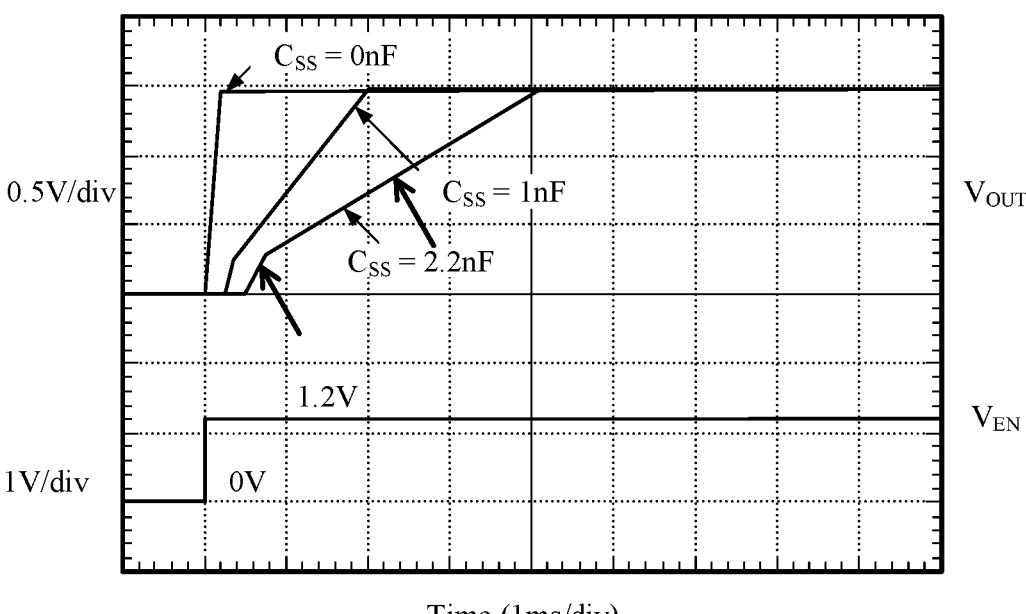
FIG. 4 illustrates a schematic of output voltage slope adjustment in an exemplary power control method according to various embodiments of the present disclosure.

In another embodiment of the present disclosure, referring to FIG. 4, FIG. 4 illustrates a schematic of output voltage slope adjustment in an exemplary power control method according to various embodiments of the present disclosure. As shown in FIG. 4, in such method, the "EN" signal passing through the FPGA (field-programmable gate array) may use a pulse-width modulation waveform (PWM, that is, pulse waveform with variable duty cycle), which may slow down the increasing rate of the output voltage, such that the charging current may not be overcurrent; and the "EN"

signal through the FPGA may use a process-variable PWM waveform, which may be adjusted throughout entire range of the voltage increase to ensure that the output has a consistent slope, which may solve the problem of fast increase in current stage and slow increase in later stage. The voltage increasing slope may be adjusted only by modifying the FPGA code without changing hardware.

Figure 5:
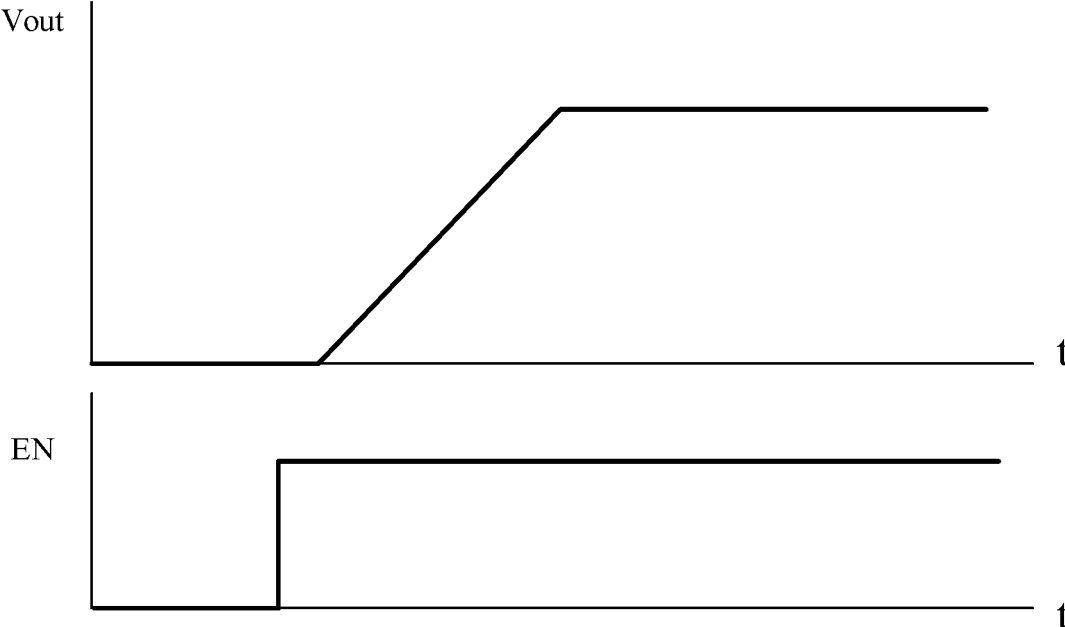
FIG. 5 illustrates a schematic of a voltage increase waveform of a stepped enable signal according to various embodiments of the present disclosure.
Figure 6:
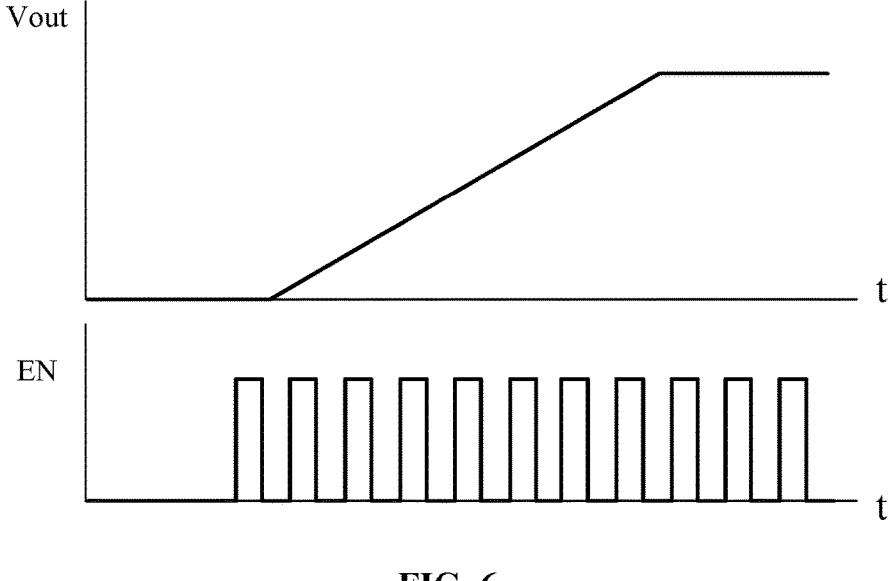
FIG. 6 illustrates a schematic of a voltage increase waveform of an enable signal using pulse-width modulation according to various embodiments of the present disclosure.

In some embodiments, the "EN" signal passing through the FPGA may use a PWM waveform to slow down the increasing rate of the output voltage, so that the charging current may not be overcurrent. Referring to FIG. 5, FIG. 5 illustrates a schematic of a voltage increase waveform of a stepped enable signal according to various embodiments of the present disclosure. As shown in FIG. 5, when using the stepped enable signal, the output voltage waveform may have a larger slope when increasing, and the voltage increasing rate may be high. FIG. 6 illustrates a schematic of a voltage increase waveform of an enable signal using pulse-width modulation according to various embodiments of the present disclosure. As shown in FIG. 6, when the pulse-width modulated waveform is configured as the enable signal, the output voltage waveform may have a smaller slope when increasing, and the voltage increasing rate may be reduced.

Figure 7:
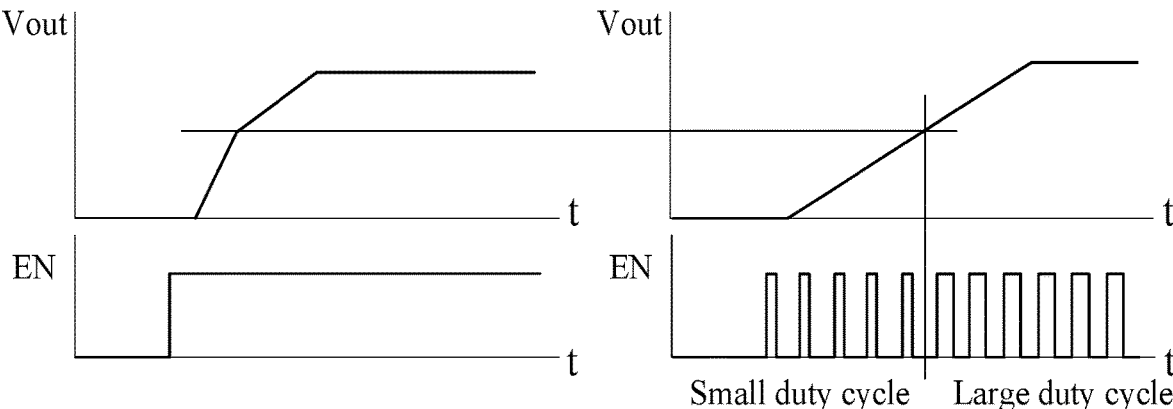
FIG. 7 illustrates a schematic of a voltage increase waveform of an enable signal using pulse-width modulation with different duty cycles according to various embodiments of the present disclosure.

In some embodiments, referring to FIG. 7, FIG. 7 illustrates a schematic of a voltage increase waveform of an enable signal using pulse-width modulation with different duty cycles according to various embodiments of the present disclosure. As shown in FIG. 7, the "EN" signal passing through the FPGA may use a process-variable PWM waveform and may be adjusted throughout entire range of voltage increase to ensure that the output slopes are consistent, which may solve the problem of rapid increase in current initial stage and slow increase in later stage. For example, during the power-on process of a same device, during the stage when the voltage increasing slope is large, a PWM waveform with a smaller duty cycle may be configured as the enable signal; and in the stage where the voltage increasing slope is small, a PWM waveform with a larger duty cycle may be configured as the enable signal. In such way, voltage increasing curves with different slopes may be adjusted to voltage increasing curves with same slope. It should be noted that the duty cycle=expected slope/original slope.

Figures 8, 9:
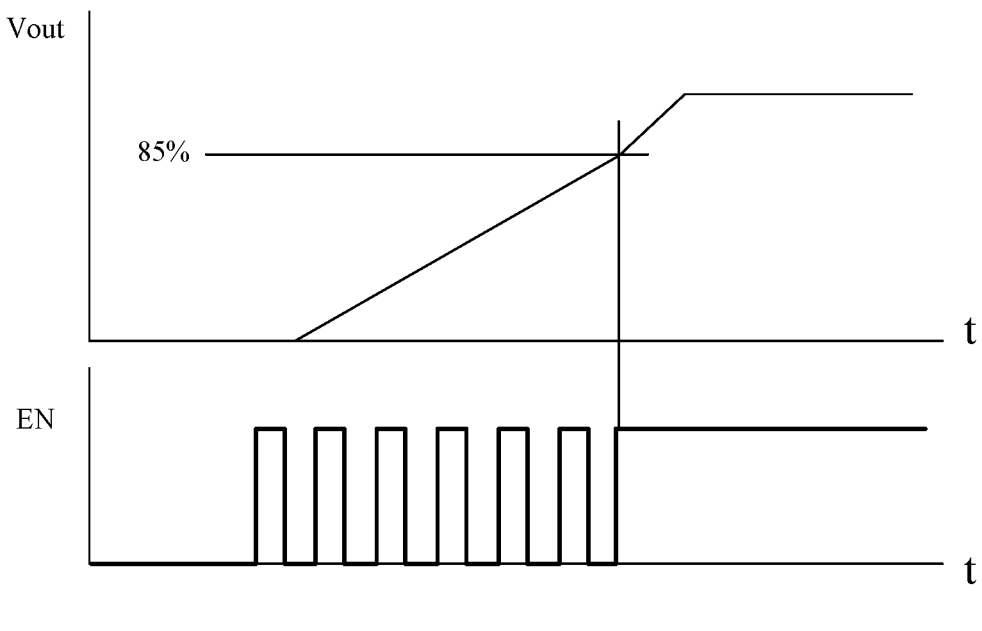
FIG. 8 illustrates another schematic of a voltage increase waveform of an enable signal using pulse-width modulation with different duty cycles according to various embodiments of the present disclosure.
FIG. 9 illustrates a schematic of an exemplary power control chip according to various embodiments of the present disclosure.

In some embodiments, referring to FIG. 8, FIG. 8 illustrates another schematic of a voltage increase waveform of an enable signal using pulse-width modulation with different duty cycles according to various embodiments of the present disclosure. As shown in FIG. 8, after the power is at 90%, in response to that the PWM wave is continued to be inputted to the EN signal, the output may also be a square wave. In order to avoid unstable output signal, when the output reaches 85% of expected value, the charging of the GPU capacitor may be basically completed. At this point, the input of PWM may be canceled and changed to DC.

In some embodiments, referring to FIG. 9, FIG. 9 illustrates a schematic of an exemplary power control chip according to various embodiments of the present disclosure. As shown in FIG. 9, in an ideal situation, during the charging process of the capacitor by the PWM wave, the capacitor may not discharge. In an actual chip, when the EN input is a high level, the capacitor may be charged, and when the EN input is at a low level, the inside of the chip may provide a discharge circuit (e.g., soft-start discharge). In order to offset such part of the discharge, the duty cycle may be appropriately increased according to actual situation to achieve expected voltage increasing slope.

Figure 10:
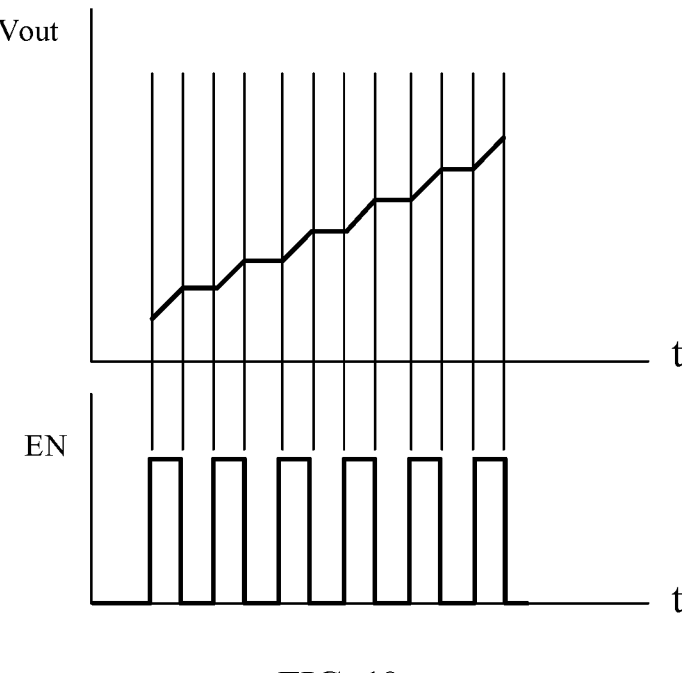
FIG. 10 illustrates a schematic of a capacitor charging waveform without discharge according to various embodiments of the present disclosure.
Figure 11:
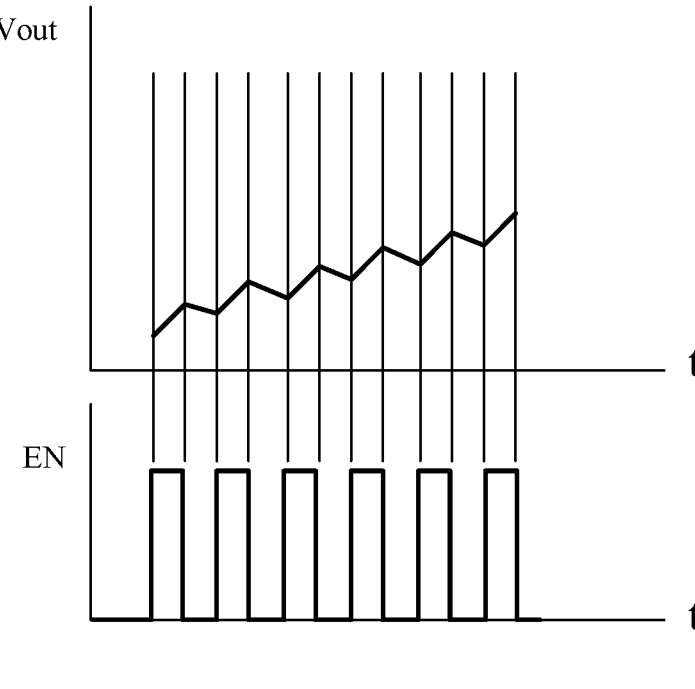
FIG. 11 illustrates a schematic of a capacitor charging waveform with discharge according to various embodiments of the present disclosure.
Figure 12:
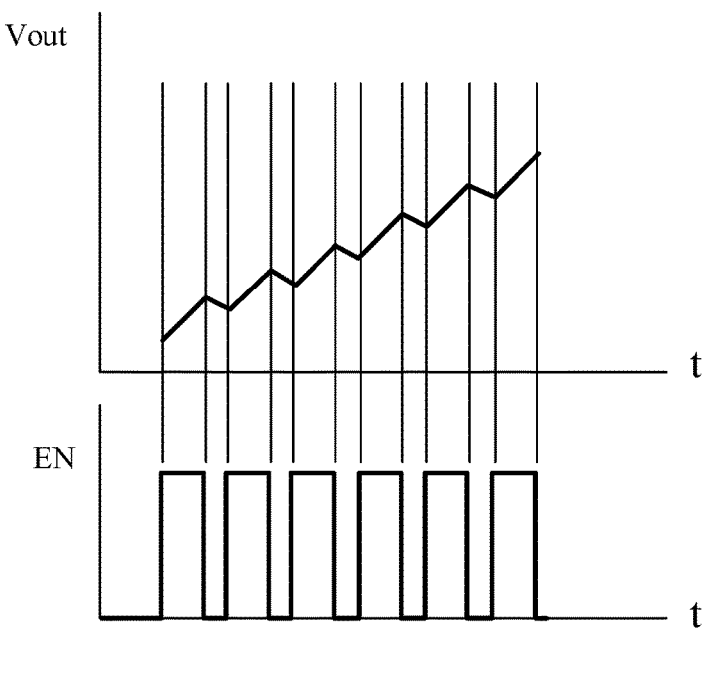
FIG. 12 illustrates another schematic of a capacitor charging waveform with discharge according to various embodiments of the present disclosure.

Exemplarily, FIG. 10 illustrates a schematic of a capacitor charging waveform without discharge according to various embodiments of the present disclosure; and FIG. 11 illustrates a schematic of a capacitor charging waveform with discharge according to various embodiments of the present disclosure. When the capacitor is discharged, actual voltage increasing slope may be smaller than ideal voltage increasing slope without discharge. Therefore, during the pulse modulation process, the duty cycle may be increased appropriately, so that when the pulse modulated waveform is configured as the enable signal, the voltage increasing slope may be consistent with expectations and may meet the charging need of the capacitor without causing overcurrent. Referring to FIG. 12, FIG. 12 illustrates another schematic of a capacitor charging waveform with discharge according to various embodiments of the present disclosure. As shown in FIG. 12, when the duty cycle is increased, the voltage increasing slope may be moderate, and expected voltage increasing slope may be achieved.

Figure 13:
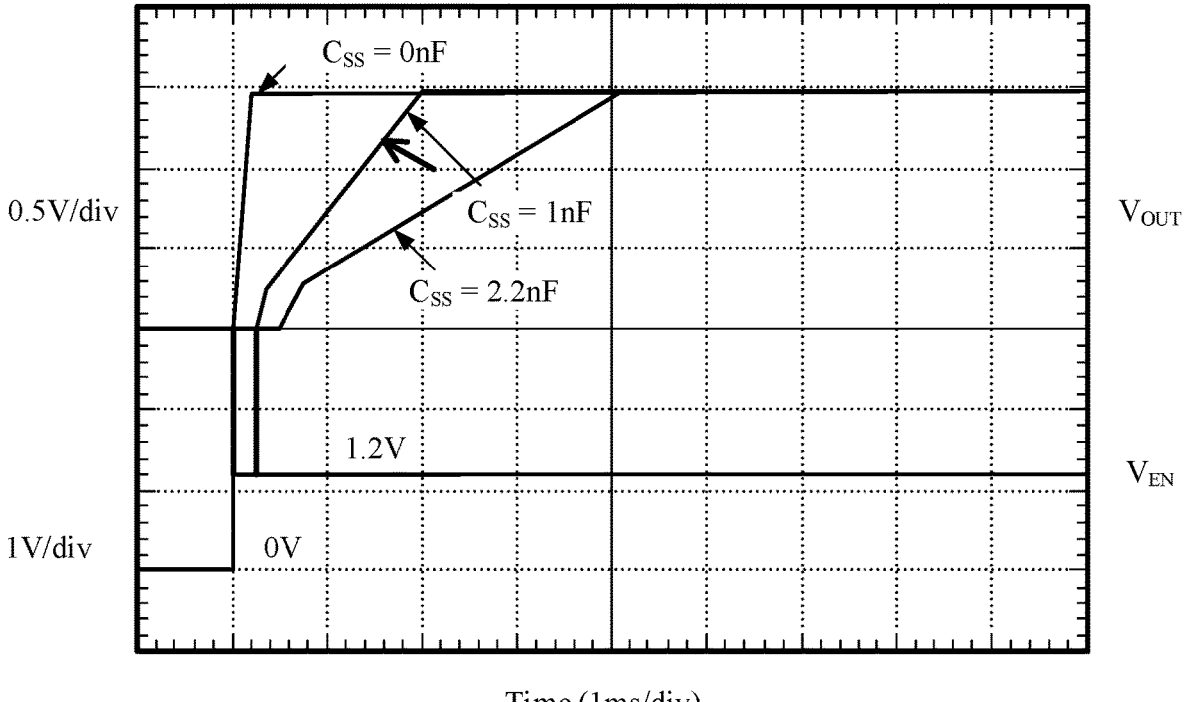
FIG. 13 illustrates another schematic of output voltage slope adjustment in an exemplary power control method according to various embodiments of the present disclosure.

In some embodiments, referring to FIG. 13, FIG. 13 illustrates another schematic of output voltage slope adjustment in an exemplary power control method according to various embodiments of the present disclosure. As shown in FIG. 13, taking the case of Css=1 nF as an example, it should be noted that when EN is changed from 0 to 1, the capacitor voltage may not start to increase immediately. At this point, the chip may be at an initial state; and the EN input may not require the PWM wave but remain at a high level. When the capacitor voltage starts to increase, the increasing slope of the capacitor voltage may start to be adjusted through the PWM manner.

Figure 14:
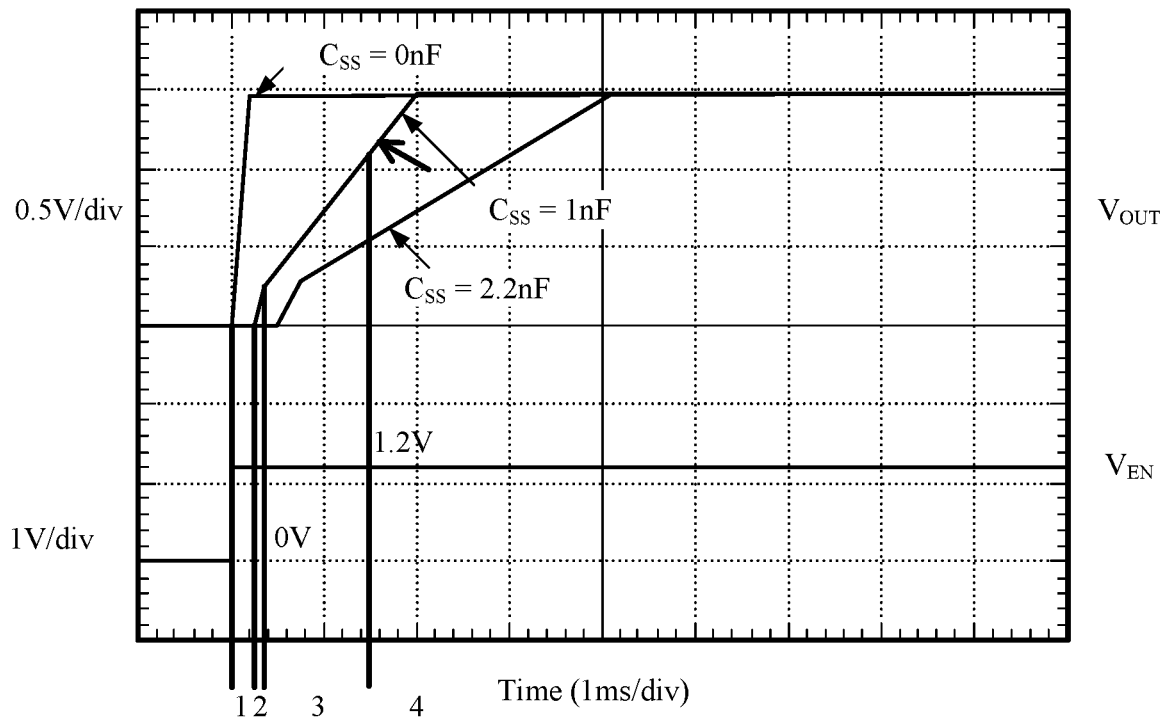
FIG. 14 illustrates another schematic of output voltage slope adjustment in an exemplary power control method according to various embodiments of the present disclosure.

In some embodiments, referring to FIG. 14, FIG. 14 illustrates another schematic of output voltage slope adjustment in an exemplary power control method according to various embodiments of the present disclosure. As shown in FIG. 14, the method may include following four exemplary stages.

At stage one, when EN starts to be at a high level and the voltage of the CSS capacitor has not yet started to increase, the high voltage DC may be maintained and the PWM strategy may not be used.

At stage two, the voltage of the CSS capacitor may increase relatively steeply during this period. The strategy of using a lower duty cycle of the PWM wave may be used to ensure that the slope is consistent with the slope at the stage three. At this point, the discharge impact of the capacitor inside the chip must be considered, and the PWM duty cycle may need to be appropriately increased.

At stage three, the voltage of the CSS capacitor may increase more slowly during this period than in the stage two, and a slightly higher duty cycle of the PWM wave may be used. At this point, the discharge impact of the capacitor inside the chip must also be considered, and the PWM duty cycle may need to be appropriately increased.

At stage four, when the CSS capacitance reaches more than 85% of expected value, in order to avoid abnormal output, the PWM strategy may be cancelled, and the EN direct current input manner may be restored.

Embodiments of the present disclosure provide a power-on control method. Based on above embodiments, specific implementation of above-mentioned embodiments is described in detail. It may be seen that according to the technical solutions of above-mentioned embodiments, the "EN" signal passing through the FPGA may use the PWM waveform to slow down the increasing rate of the output voltage, so that the charging current may not be overcurrent; and the "EN" signal passing through the FPGA may use the process-variable PWM waveform, which may be adjusted throughout entire range of the voltage increase to ensure that the output has a consistent slope. By adjusting the pulse-width of the enable signal, the increasing rate of the output voltage may be controlled, which may reduce overcurrent risk during power-on.

Figure 15:
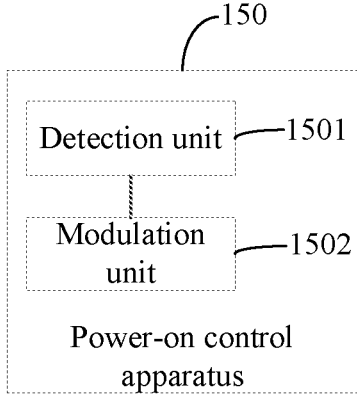
FIG. 15 illustrates a structural schematic of an exemplary power-on control apparatus according to various embodiments of the present disclosure.

In another embodiment of the present disclosure, referring to FIG. 15, FIG. 15 illustrates a structural schematic of an exemplary power-on control apparatus according to various embodiments of the present disclosure.

As shown in FIG. 15, a power-on control apparatus 150 may include a detection unit 1501, configured to, in response to receiving the power-on command, switch the enable signal of the power control chip from a low level to a high level, and monitor the output voltage of the power control chip; and a modulation unit 1502, configured to perform the pulse-width modulation on the enable signal according to the increasing trend of the output voltage to control the increasing rate of the output voltage.

In some embodiments, the modulation unit 1502 may be configured to obtain the increasing rate of current output voltage; based on the ratio of the target increasing rate to the increasing rate of current output voltage, determine the target duty cycle of the enable signal for the pulse-width modulation; and perform the pulse-width modulation on the enable signal according to the target duty cycle to control the increasing rate of the output voltage.

In some embodiments, the modulation unit 1502 may be configured to reduce the current duty cycle corresponding to current output voltage in response to that the increasing rate of current output voltage is greater than the target increasing rate; and determine reduced duty cycle as the target duty cycle.

In some embodiments, the modulation unit 1502 may be configured to increase current duty cycle corresponding to current output voltage in response to that the increasing rate of current output voltage is less than the target increasing rate; and determine the increased duty cycle as the target duty cycle.

In some embodiments, the modulation unit 1502 may be configured to determine current duty cycle corresponding to current output voltage to be the target duty cycle in response to that the increasing rate of the current output voltage is equal to the target increasing rate.

In some embodiments, the modulation unit 1502 may be configured to calculate the ratio of the target increasing rate to current duty cycle corresponding to current output voltage; and determine the ratio as the target duty cycle.

In some embodiments, the modulation unit 1502 may be configured to be that, in response to that a discharge circuit is inside the power control chip, the duty cycle of the pulse-width modulation of the enable signal may be greater than the target duty cycle.

In some embodiments, the modulation unit 1502 may be configured to, in response to that the output voltage does not start to increase, maintain the enable signal to be inputted at a high level; and in response to that the output voltage reaches a preset ratio, maintain the enable signal to be inputted at a high level.

It may be understood that in one embodiment, the "unit" may be a part of a circuit, a part of a processor, a part of a program or software and the like; and obviously, may also be modular or non-modular. Moreover, each component in one embodiment may be integrated into one processing unit, or each unit may exist physically alone, or two or more units may be integrated into one unit. Above integrated units may be implemented in the form of hardware or software function modules.

In response to the integrated unit is implemented in the form of the software function module and is not sold or used as an independent product, the integrated unit may be stored in a computer-readable storage medium. Based on such understanding, in one embodiment, the technical solution may be essentially embodied in the form of a software product; or the contribution part to the existing technology, or all or a part of the technical solution may be embodied in the form of a software product. The computer software product may be stored in a storage medium and include a plurality of instructions to cause a computer device (may be a personal computer, a server, or a network device or the like) or a processor to execute all or a part of exemplary steps of the method described in one embodiment. Above-mentioned storage media may include a U disk, a mobile hard disk, read only memory (ROM), random access memory (RAM), a magnetic disk or an optical disk, and/or other various media that may store program code.

Therefore, a computer storage medium is provided in one embodiment. The computer storage medium may store a computer program that implements exemplary steps of the method described in any one of above-mentioned embodiments when executed by at least one processor.

Figure 16:
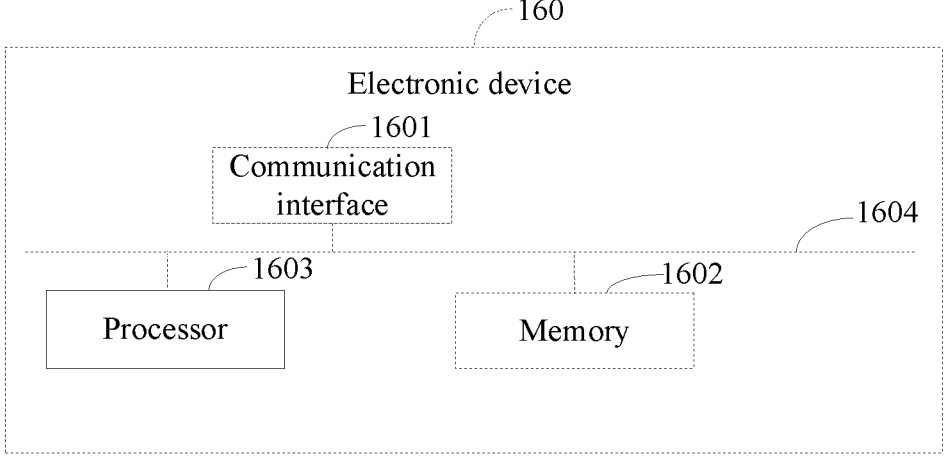
FIG. 16 illustrates a hardware structural schematic of an electronic device according to various embodiments of the present disclosure.

Based on the composition of the control apparatus 150 and the computer storage medium described above, referring to FIG. 16, FIG. 16 illustrates a hardware structural schematic of an electronic device according to various embodiments of the present disclosure. As shown in FIG. 16, the electronic device 160 may include a communication interface 1601, a memory 1602, and a processor 1603; each component may be coupled together through a bus system 1604. It may be understood that the bus system 1604 may be configured to implement connection communication between above components. In addition to the data bus, the bus system 1604 may also include a power bus, a control bus, and a status signal bus. However, for clarity, various buses may be labeled as the bus system 1604 in FIG. 16. The communication interface 1601 may be configured to receive and send signals during the process of sending and receiving information with other external network elements. The memory 1602 may be configured to store computer programs capable of running on the processor 1603. The processor 1603 may be configured to, when executing the computer program, execute the following: in response to receiving the power-on command, switching the enable signal of the power control chip from a low level to a high level, and monitoring the output voltage of the power control chip; and performing the pulse-width modulation on the enable signal according to the increasing trend of the output voltage to control the increasing rate of the output voltage.

It may be understood that the memory 1602 in embodiments of the present disclosure may be a volatile memory or a non-volatile memory; or may include both volatile and non-volatile memories. Non-volatile memory may be read-only memory (ROM), programmable read-only memory (PROM), erasable programmable read-only memory (erasable PROM or EPROM), electrically erasable memory programmable read-only memory (electrically EPROM or EEPROM), or flash memory. Volatile memory may be random access memory (RAM), which may be used as an external cache. Exemplarily (not limiting), various forms of RAM may be available. RAM may include, for example, static random access memory (SRAM), dynamic random access memory (dynamic RAM or DRAM), synchronous dynamic random access memory (synchronous DRAM or SDRAM), double data rate synchronous dynamic random access memory (double data rate SDRAM or DDRS-DRAM), enhanced synchronous dynamic random access memory (enhanced SDRAM or ESDRAM), synchronous link dynamic random access memory (synchronous link DRAM or SLDRAM) and direct Rambus RAM (DRRAM). The memory 1602 of the system and method described in the present disclosure may be intended to include, but not be limited to above-mentioned memory and any other suitable types of memory.

Furthermore, the processor 1603 may be an integrated circuit chip with signal processing capability. During the implementation process, each step of above-mentioned method may be completed by instructions in the form of hardware integrated logic circuits or software in the processor 1603. Above-mentioned processor 1603 may be a general-purpose processor, a digital signal processor (DSP), an application specific integrated circuit (ASIC), a field programmable gate array (FPGA) or other programmable logic device, a discrete gate or transistor logic device, or a discrete hardware component. Each method, step and logical block diagram disclosed in embodiments of the present disclosure may be implemented or executed. A general-purpose processor may be a microprocessor, or the processor may be any conventional processor or the like. Exemplary steps of the method disclosed in conjunction with embodiments of the present disclosure may be directly implemented by a hardware decoding processor or executed by a combination of hardware and software modules in a decoding processor. The software module may be located in random access memory, flash memory, read-only memory, programmable read-only memory or electrically erasable programmable memory, register and other mature storage media in such field. The storage medium may be located in the memory 1602. The processor 1603 may read the information in the memory 1602 and complete exemplary steps of above-mentioned method in combination with its hardware.

It is understood that embodiments described herein may be implemented in hardware, software, firmware, middleware, microcode, or a combination thereof. For hardware implementation, the processing unit may be embodied in one or more of an application specific integrated circuit (ASIC), digital signal processing (DSP), a digital signal processing device (DSP Device or DSPD), a programmable logic device (PLD), a field-programmable gate array (FPGA), a general-purpose processor, a controller, a microcontroller, a microprocessor, and other devices, which may be used to perform the functions described in the electronic units or combination of the present disclosure.

For software implementation, the technical solutions described in the present disclosure may be implemented through modules (e.g., procedures, functions and the like) that may perform the functions described herein. Software code may be stored in memory and executed by the processor. The memory may be implemented in the processor or in the external of the processor.

Optionally, in another embodiment, the processor 1603 may be further configured to perform exemplary steps of the method described in any of above-mentioned embodiments when the computer program is executed.

Figure 17:
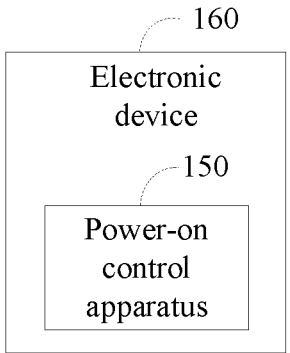
FIG. 17 illustrates a structural schematic of an electronic device according to various embodiments of the present disclosure.

In another embodiment of the present disclosure, referring to FIG. 17, FIG. 17 illustrates a structural schematic of an electronic device according to various embodiments of the present disclosure. As shown in FIG. 17, the electronic device 160 may at least include the power-on control apparatus 150 described in any one of above-mentioned embodiments.

In embodiments of the present disclosure, for the electronic device 160, when receiving the power-on instruction, the enable signal of the power control chip may be switched from a low level to a high level, and the output voltage of the power control chip may be monitored; and the enable signal may be pulse-width modulated according to the increasing trend of the output voltage to control the increasing rate of the output voltage. In such way, the increasing rate of the output voltage may be controlled by adjusting the pulse-width of the enable signal, thereby reducing overcurrent risk during power-on.

It should be noted that in the present disclosure, the terms "include", "comprise" or any other variations thereof may be intended to cover non-exclusive inclusion. Therefore, a process, a method, an article or an apparatus that includes a list of elements may include not only those elements, but also other elements not expressly listed, or elements that are inherent to the process, the method, the article or the apparatus. Without further limitation, an element defined by the statement "comprises a . . . " may not exclude the presence of additional identical elements in a process, a method, an article or an apparatus that includes such element.

The above serial numbers of embodiments of the present disclosure may be only for description and may not indicate advantages or disadvantages of embodiments of the present disclosure.

The methods disclosed in multiple method embodiments provided in the present disclosure may be combined arbitrarily to obtain new method embodiments without conflict.

The features disclosed in multiple product embodiments provided in the present disclosure may be combined arbitrarily without conflict to obtain new product embodiments.

The features disclosed in multiple method or device embodiments provided in the present disclosure may be combined arbitrarily without conflict to obtain new method embodiments or device embodiments.

Compared with the existing technology, the technical solutions provided by the present disclosure may achieve at least the following beneficial effects.

The embodiment of the present disclosure provides the power-on control method, the electronic device and the storage medium. When receiving the power-on instruction, the enable signal of the power control chip may be switched from a low level to a high level, and the output voltage of the power control chip may be monitored; and the enable signal may be pulse-width modulated according to the increasing trend of the output voltage to control the increasing rate of the output voltage. In such way, the increasing rate of the output voltage may be controlled by adjusting the pulse-width of the enable signal, thereby reducing overcurrent risk during power-on.

The above may be only embodiments of the present disclosure, but the protection scope of the present disclosure may not be limited thereto. Those skilled in the art may easily think of changes or substitutions within the technical scope disclosed in the present disclosure, which should be covered by the protection scope of the present disclosure. Therefore, the protection scope of the present disclosure should be subject to the protection scope of the claims.

What is claimed is:

1. A power-on control method, comprising:

in response to receiving a power-on command, switching an enable signal of a power control chip from a low level to a high level, and monitoring an output voltage of the power control chip;

obtaining a current increasing rate of the output voltage; and performing pulse-width modulation on the enable signal according to the current increasing rate of the output voltage and a target increasing rate of the output voltage to control an increasing rate of the output voltage, including:

calculating a current duty cycle according to a ratio of the target increasing rate to the current increasing rate of the output voltage: determining a target duty cycle of the enable signal for the pulse-width modulation according to the current duty cycle, including at least one of:

in response to that the current increasing rate of the output voltage is greater than the target increasing rate, reducing the current duty cycle corresponding to the current increasing rate of the output voltage, and determining the reduced duty cycle to be the target duty cycle:

in response to that the current increasing rate of the output voltage is less than the target increasing rate, increasing the current duty cycle corresponding to the current increasing rate of the output voltage, and determining the increased duty cycle to be the target duty cycle;

in response to that the current increasing rate of the output voltage is equal to the target increasing rate, determining the current duty cycle corresponding to the current increasing rate of the output voltage to be the target duty cycle; or calculating a ratio of the target increasing rate to the current duty cycle, and determining the ratio of the target increasing rate to the current duty cycle to be the target duty cycle; and according to the target duty cycle, performing the pulse-width modulation on the enable signal to control the increasing rate of the output voltage.

2. The method according to claim 1, wherein:

in response to that a discharge circuit is inside the power control chip, a duty cycle of the pulse-width modulation of the enable signal is greater than the target duty cycle.

3. The method according to claim 1, further including:

in response to that the output voltage does not start to increase, maintaining the enable signal to be inputted at a high level; and in response to that the output voltage reaches a preset ratio, maintaining the enable signal to be inputted at a high level.

4. An electronic device, comprising:

a memory, configured to store a computer program; and a processor, coupled to the memory and, when the computer program is executed, configured to:

in response to receiving a power-on command, switch an enable signal of a power control chip from a low level to a high level, and monitor an output voltage of the power control chip;

obtain a current increasing rate of the output voltage; and perform pulse-width modulation on the enable signal according to the current increasing rate of the output voltage and a target increasing rate of the output voltage to control an increasing rate of the output voltage, including:

calculating a current duty cycle according to a ratio of the target increasing rate to the current increasing rate of the output voltage;

determining a target duty cycle of the enable signal for the pulse-width modulation according to the current duty cycle, including at least one of:

in response to that the current increasing rate of the output voltage is greater than the target increasing rate, reducing the current duty cycle corresponding to the current increasing rate of the output voltage, and determining the reduced duty cycle to be the target duty cycle;

in response to that the current increasing rate of the output voltage is less than the target increasing rate, increasing the current duty cycle corresponding to the current increasing rate of the output voltage, and determining the increased duty cycle to be the target duty cycle;

in response to that the current increasing rate of the output voltage is equal to the target increasing rate, determining the current duty cycle corresponding to the current increasing rate of the output voltage to be the target duty cycle; or calculating a ratio of the target increasing rate to the current duty cycle, and determining the ratio of the target increasing rate to the current duty cycle to be the target duty cycle; and according to the target duty cycle, performing the pulse-width modulation on the enable signal to control the increasing rate of the output voltage.

5. The electronic device according to claim 4, wherein:

in response to that a discharge circuit is inside the power control chip, a duty cycle of the pulse-width modulation of the enable signal is greater than the target duty cycle.

6. The electronic device according to claim 4, wherein the processor is further configured to:

in response to that the output voltage does not start to increase, maintain the enable signal to be inputted at a high level; and in response to that the output voltage reaches a preset ratio, maintain the enable signal to be inputted at a high level.

7. A non-transitory computer-readable storage medium, containing a computer program that, when being executed, causes a processor to:

in response to receiving a power-on command, switch an enable signal of a power control chip from a low level to a high level, and monitor an output voltage of the power control chip;

obtain a current increasing rate of the output voltage; and perform pulse-width modulation on the enable signal according to the current increasing rate of the output voltage and a target increasing rate of the output voltage to control an increasing rate of the output voltage, including:

calculating a current duty cycle according to a ratio of the target increasing rate to the current increasing rate of the output voltage;

determining a target duty cycle of the enable signal for the pulse-width modulation according to the current duty cycle, including at least one of:

in response to that the current increasing rate of the output voltage is greater than the target increasing rate, reducing the current duty cycle corresponding to the current increasing rate of the output voltage, and determining the reduced duty cycle to be the target duty cycle;

in response to that the current increasing rate of the output voltage is less than the target increasing rate, increasing the current duty cycle corresponding to the current increasing rate of the output voltage, and determining the increased duty cycle to be the target duty cycle;

in response to that the current increasing rate of the output voltage is equal to the target increasing rate, determining the current duty cycle corresponding to the current increasing rate of the output voltage to be the target duty cycle; or calculating a ratio of the target increasing rate to the current duty cycle, and determining the ratio of the target increasing rate to the current duty cycle to be the target duty cycle; and according to the target duty cycle, performing the pulse-width modulation on the enable signal to control the increasing rate of the output voltage.

* * * * *